United States Patent [19]
Lakin

[11] Patent Number: 5,942,958
[45] Date of Patent: Aug. 24, 1999

[54] SYMMETRICAL PIEZOELECTRIC RESONATOR FILTER

[75] Inventor: Kenneth Meade Lakin, Redmond, Oreg.

[73] Assignee: TFR Technologies, Inc., Bend, Oreg.

[21] Appl. No.: 09/122,904

[22] Filed: Jul. 27, 1998

[51] Int. Cl.[6] .............................. H03H 9/56; H03H 9/54
[52] U.S. Cl. ...................... 333/189; 310/320; 310/366; 333/191
[58] Field of Search .................................. 333/187–192; 310/320–324, 328, 366

[56] References Cited

U.S. PATENT DOCUMENTS 3,222,622  12/1965  Curran et al. ........................... 333/192
5,692,279  12/1997  Mang et al. ......................... 310/324 X
5,872,493   2/1999  Ella ........................................ 333/191

*Primary Examiner*—Robert Pascal
*Assistant Examiner*—Barbara Summons
*Attorney, Agent, or Firm*—G. Joseph Buck

[57] ABSTRACT

A microwave filter made of piezoelectric resonators fabricated in a monolithic device. Combinations of resonators connected in series and and parallel to each other are laid out in a symmetrical compact arrangement providing symmetrical and similar paths connecting the resonators together and to the ground. The symmetrical layout thus avoids differences in the connector inductances that otherwise would degrade filter performance.

12 Claims, 6 Drawing Sheets

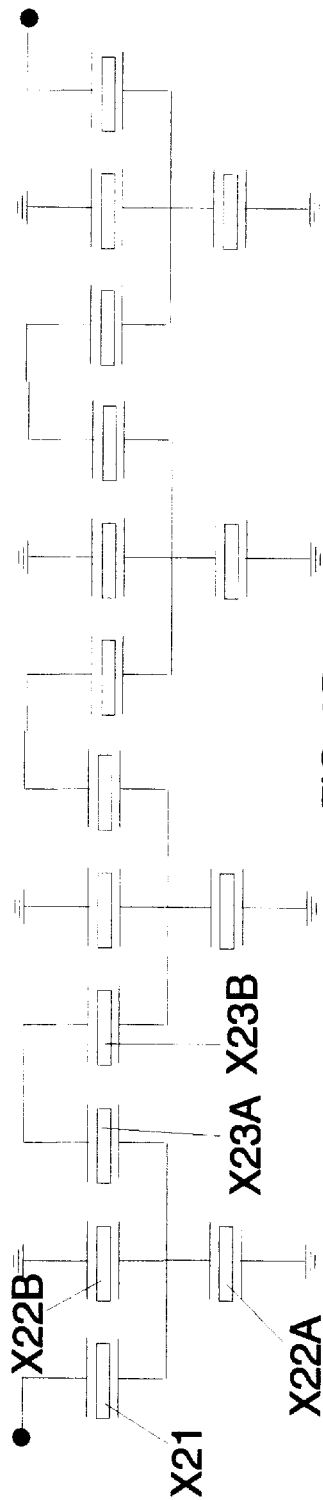
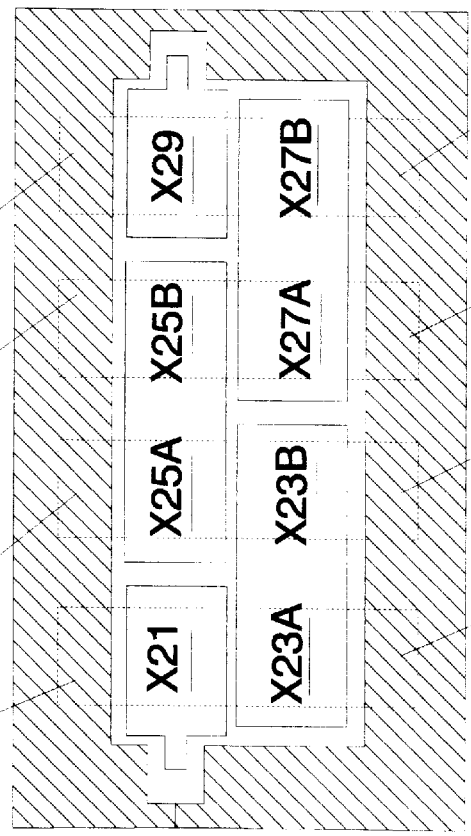
FIG. 2B
FIG. 2A
PRIOR ART

SYMMETRICAL PIEZOELECTRIC RESONATOR FILTER

BACKGROUND OF THE INVENTION

1. Field of the Invention

This invention pertains to electronic filters that utilize piezoelectric resonators. More particularly this invention pertains to microwave piezoelectric filters that utilize piezoelectric resonators fabricated as part of a monolithic device.

2. Description of the Prior Art

In the prior art, microwave electronic filters have been manufactured that utilize piezoelectric resonators that are fabricated in monolithic form on a substrate. See e.g. "Development of Miniature Filters for Wireless Applications", Lakin, Kline, McCarron, IEEE Trans. Microwave Theory and Techniques, Vol. 43, No. 12, December 1995, pp. 2933–2929; "Thin Film Bulk Acoustic Wave Filters for GPS", K. M. Lakin, G. R. Kline, and K. T. McCarron, 1992, Ultrasonics Symposium Proc. pp. 471–476; High-Q Microwave Acoustic Resonators and Filters," by Lakin, Kline and McCarron, IEEE Trans. on Microwave Theory and Techniques, Vol. 41, No. 12, December 1993, p. 2139. One such method of fabricating piezoelectric resonators consists of first depositing a layer of conducting material upon the upper surface of a non-conducting substrate and then removing portions of the conductor by etching so as to leave a desired pattern of conductors. A layer of piezoelectric material is then deposited upon the upper surface followed by the deposition of another layer of conducting material. Portions of the uppermost conducting material are then removed by etching leaving a second desired pattern of conductors on the upper surface of the piezoelectric material. Each portion of the layer of piezoelectric matter that is sandwiched between two conductors, together with the bonding conductors may then act as a piezoelectric resonator. In some prior art devices, these resonators are supported upon one or more layers of material that provide, in effect, either a fixed surface having a high mechanical impedance to vibration, or a "free" surface having a low mechanical impedance to vibration. See, e.g. U.S. Pat. Nos. 3,414,832 and 5,373,268. In some prior art devices, areas of the substrate located beneath the resonators are removed so as to leave the resonators as thin membranes. Another method for fabricating resonators is the classical method wherein conducting electrodes are fabricated upon the lower and upper surfaces of a piezoelectric crystal plate or slab.

FIG. 1A depicts the layout of a filter of the prior art in which a plurality of resonators are fabricated upon a wafer or substrate 1 by using a sequence of deposition and etching processes in which conductors and piezoelectric material are deposited upon, and removed from the surface of a substrate so as to form a layer of piezoelectric material sandwiched between upper and lower patterns of conductors. In the layout depicted in FIG. 1A, the boundaries of conductors located upon the upper surface are drawn with solid lines and the boundaries of conductors located beneath the layer of piezoelectric or other material are drawn with dashed lines. In addition, the area covered by ground conductor 2, which is located on the upper surface 3 of the device and which conductor acts as an electrical ground, is indicated by shading.

Each resonator consists of a thin layer of piezoelectric material sandwiched between two layers of conducting material, with the volume of the piezoelectric material that comprises each resonator being defined approximately by the overlapping areas of the two conductors. For example, resonator X11 consists of a layer of piezoelectric material sandwiched between and approximately bounded by the area of overlap of conductor 4, which conductor 4 is located on the surface of the substrate, by conductor 5, which conductor 5 is located beneath the layer of piezoelectric material. The resonator includes the portions of the upper and lower conductors that bound the piezoelectric layer and which approximately define the boundaries of the resonator. The two areas over which conductor 5 overlaps ground conductor 2, approximately define the boundaries of resonators X12A and X12B. Similarly, the area of overlap of conductor 5 by conductor 6 approximately defines the boundary of resonator X13A. In a similar manner, the locations of resonators X13B, X14A, X14B, X15A, X15B, X16A, X16B and X17 are approximately defined by the areas of overlap of the conductors on the upper and lower surfaces of the piezoelectric material. The filter has an input terminal 7 and an output terminal 8 relative to ground conductor 2.

FIG. 1B is a schematic drawing of a simplified equivalent circuit of the filter depicted in FIG. 1A. FIG. 1C is a simplification of the schematic diagram of FIG. 1B in which the pairs of resonators connected in series, that is having a serial connection between them, e.g. X13A and X13B are represented by single, equivalent resonators, e.g. X13, and the pairs of resonators connected in parallel, e.g. X12A and X12B, are represented by single, equivalent resonators, e.g. X12. As indicated in FIG. 1C, the equivalent circuit of the filter is, in effect a combination of series and shunt resonators connected in the form of a ladder. One side of the ladder is the signal or "hot" side of the ladder, and the other side of the ladder is the electrical ground. The "hot" side of the ladder consists of resonators connected in series to each other (the "series" resonators) and the rungs of the ladder consist of "shunt" resonators connected between the ground side of the ladder and the connections between the series resonators.

In this specification, and in the claims, the words "series resonator(s)" are used to describe one or more resonators that either by themselves, or in combination with one or more other resonators together operate as a "series resonator" in the sense that the "hot side", or signal carrying side, of the filter circuit passes through these resonators. Similarly, the words "shunt resonator(s) are used to describe one or more resonators that either by themselves, or in combination with one or more other resonators together operate as a "shunt resonator" in the sense that at least one electrical terminal of the combination of shunt resonators is connected to the ground side of the filter. Resonators may be connected to each other in a serial combination, sometimes referred to as a series connection, as being connected in series with each other or "in series". The resonators also may be connected to each other in a parallel combination, sometimes referred to as a parallel connection or "in parallel".

The input 7 and output 8 of the filter, as well as the all of the resonators are symmetrically located, and symmetrically connected, relative to ground conductor 2. As a consequence the path length for a ground current flowing in ground conductor 2 from the portion of ground conductor 2 adjacent to input 7 to the ground connection of X12A is the same as the path length to X12B. As a consequence the inductances associated with these paths are also equal. The paths for the currents flowing in the ground conductor and the associated inductances similarly are equal for resonators X14A and X14B, etc. The inductances in the ground paths cause a small shift in the resonant frequencies of the respective shunt resonators.

When more resonators are added to a filter that is arranged as depicted in FIG. 1A, the ratio of the length to the width of the filter becomes greater, i.e. has a higher aspect ratio, which high ratio may give rise to undesirable electrical and/or physical properties.

FIG. 2A depicts a filter of the prior art that is similar to the ladder filter depicted in FIG. 1A, that includes two additional series resonators and two additional shunt resonators. The electrical path along the "hot" side of the ladder filter in FIG. 2A, i.e. along series resonators X21 to X23A to X23B to X25A to X25B X27A to X27B to X29 has been changed to a meandering path in order to shorten the length of the filter making the filter more compact and reducing its aspect ratio. The device depicted in FIG. 2A, includes shunt resonators X22A, X22B, X24A, X24B, X26A, X26B X28A and X28B. FIG. 2B is a simplified schematic diagram of the filter depicted in FIG. 2A showing the series and shunt resonators.

Unfortunately, the asymmetrical layout in FIG. 2 of the components relative to the ground conductor provides path lengths within the ground conductor from the vicinity of input and output connectors to the connections between the shunt resonators and ground which are no longer equal. As a consequence the "ground path" inductances associated with these paths, also, are no longer equal. The unequal ground path inductances shift the resonant frequencies of the respective shunt resonators unequally, which unequal shifts degrade filter performance. In particular, the out-of-band rejection by the filter is significantly degraded.

SUMMARY OF THE INVENTION

The present invention provides a compact arrangement of series and shunt resonators that has a relatively low aspect ratio, and in which the resonators are symmetrically located with respect to the ground conductor. As a consequence, the ground path inductances for ground currents flowing to respective pairs of shunt inductances are equal and the filter performance is not degraded by the compaction of the elements.

BRIEF DESCRIPTION OF THE DRAWINGS

FIG. 2A depicts the layout of a prior art filter in which the resonators have been rearranged into a layout that is more compact than the layout depicted in FIG. 1A. FIG. 2B is a simplified schematic diagram of the filter depicted in FIG. 2A.

DETAILED DESCRIPTION

Figure 3A:
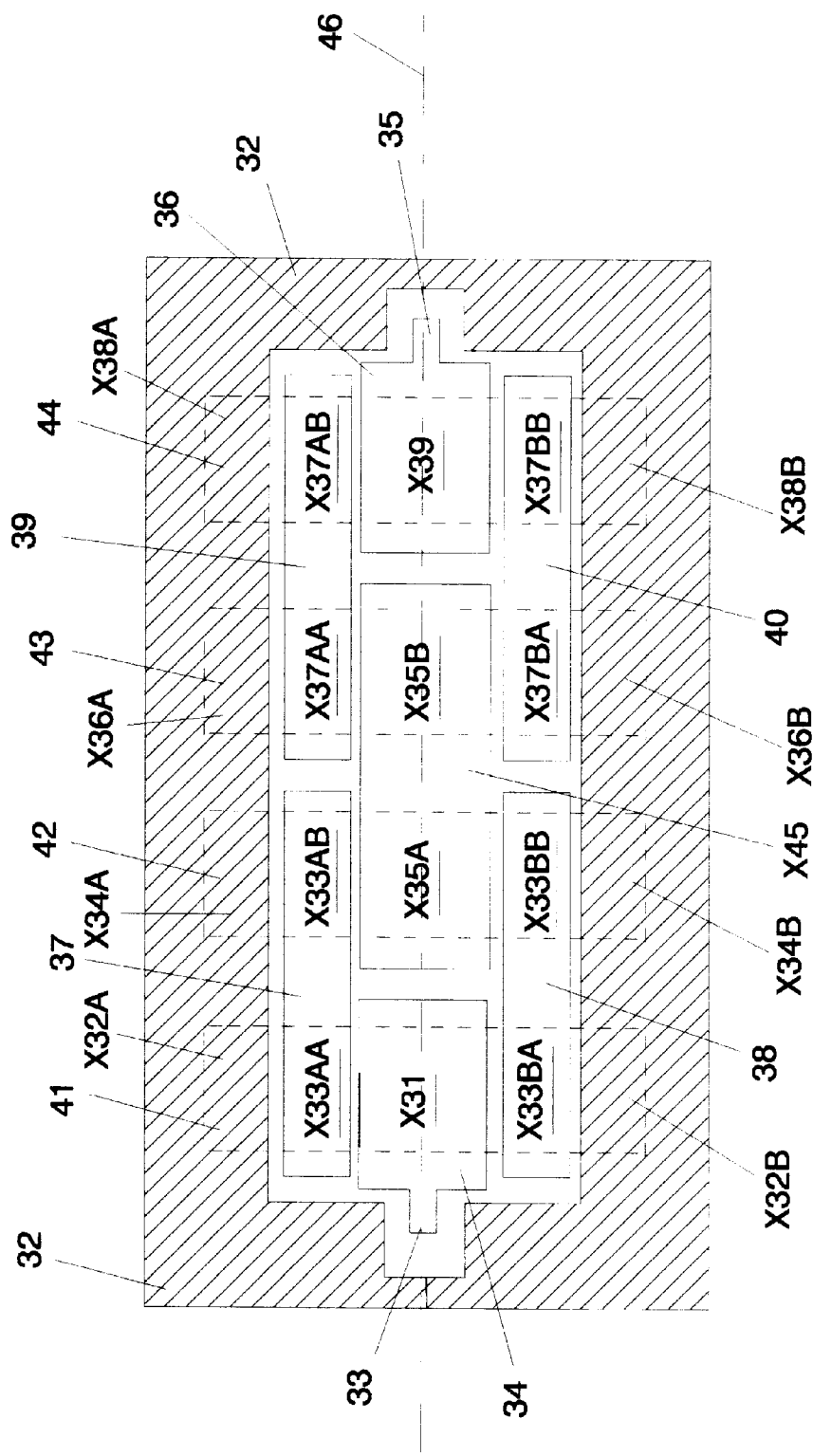
FIG. 3A depicts the layout of the preferred embodiment of the present invention.

Referring now to FIG. 3A. The preferred embodiment of this invention is a filter comprised of a number of series and shunt resonators connected together such that the combinations of series resonators and combinations of shunt resonators are connected together in the form of a ladder. As in the prior art, a layer of piezoelectric material is sandwiched between a pattern of conductors on its upper surface and a second pattern of conductors on the lower surface of the layer of piezoelectric material. The layer of piezoelectric material and the upper and lower patterns of conducting material are supported on a substrate. In some embodiments of the invention, portions of the supporting substrate may be removed so as to leave the individual resonators as membranes. In other embodiments, the substrate may include layers of material that, in effect, provide either a supporting surface for the resonators which supporting surface has either a high or a low impedance to the mechanical vibrations of the resonators.

Figure 1A:
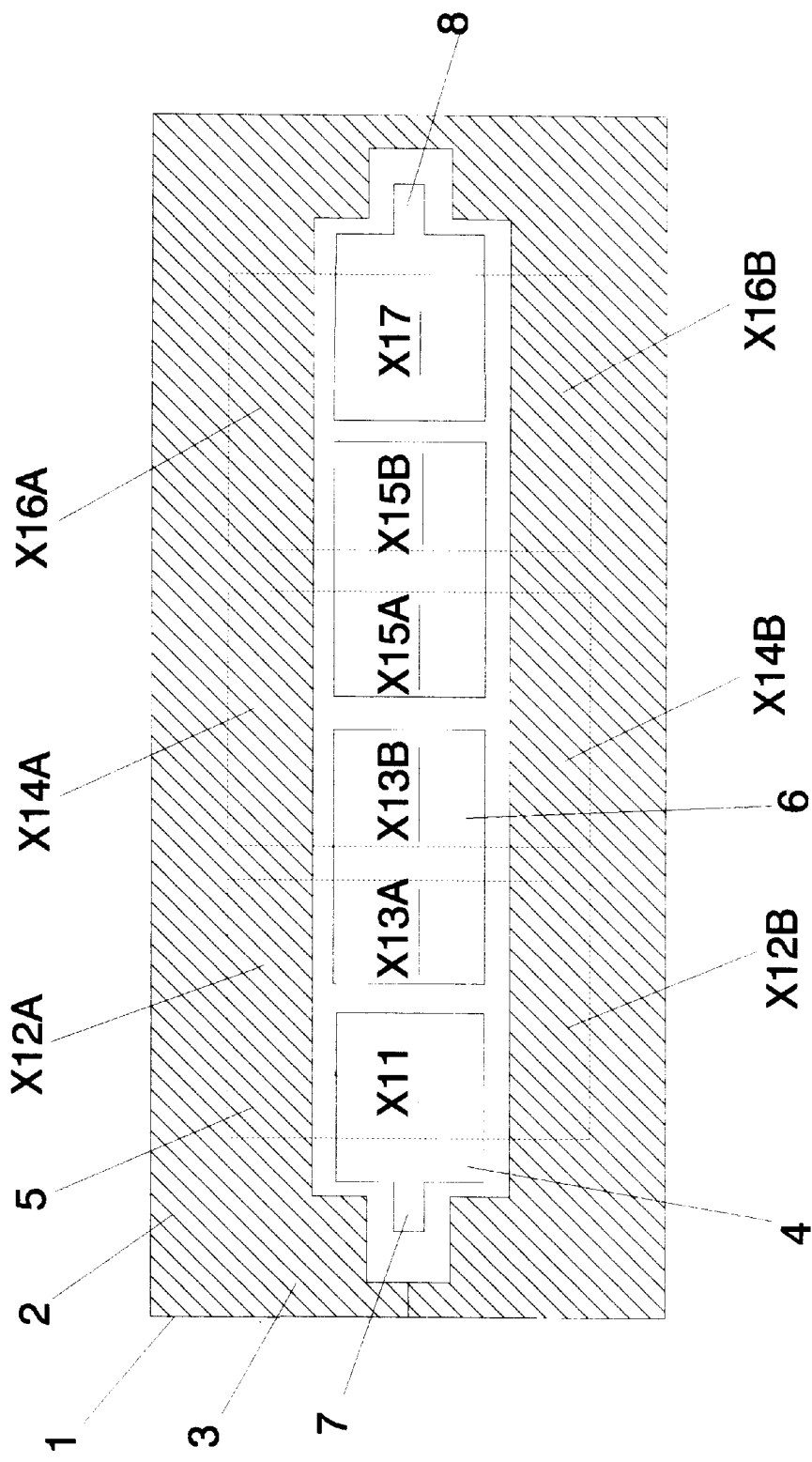
FIG. 1A depicts the layout of a prior art monolithic piezoelectric resonator filter.
Figure 1C:
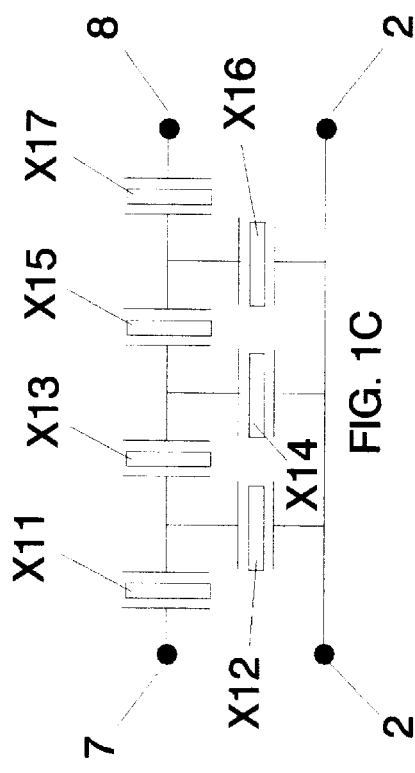
FIG. 1B is a simplified schematic diagram of the filter and FIG. 1C is schematic diagram of the filter which has been further simplified by combining serial and parallel combinations of resonators into single resonators.
Figure 1B:
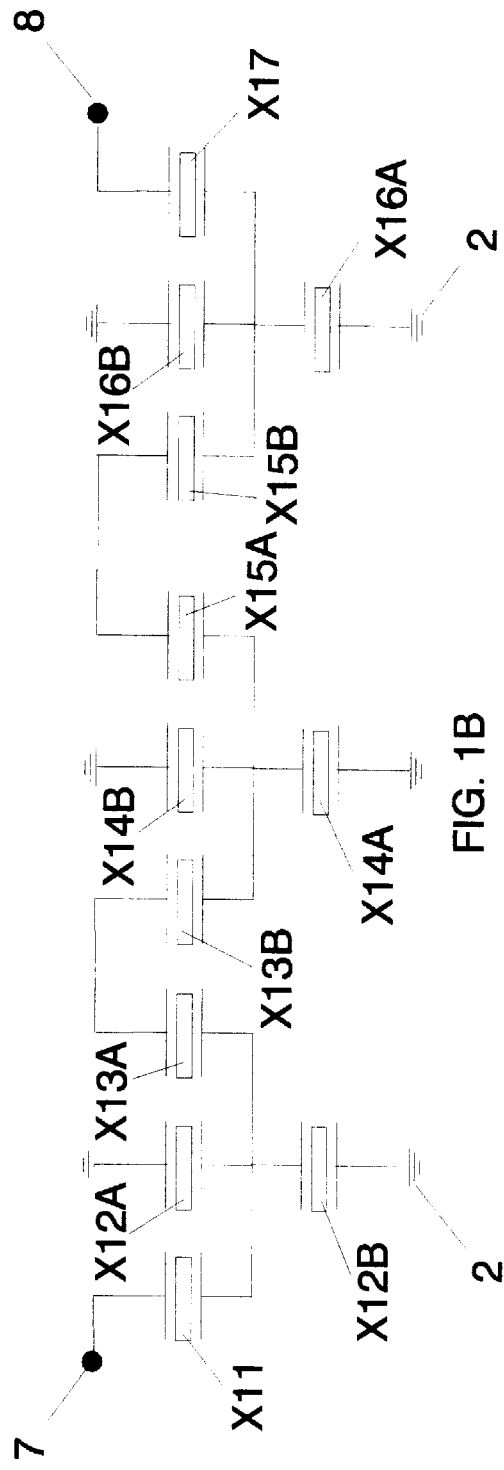

In the preferred embodiment of FIG. 3A, ground conductor 32 is located upon the upper surface of the layer of piezoelectric material. In the same manner as depicted in FIG. 1A, the boundaries of the conductors located on the upper surface of the piezoelectric layer of material are indicated with solid lines, while the boundaries of the conducting material located on the lower surface of the piezoelectric layer of material are indicated with dashed lines. An electrical signal is input to the filter as a voltage at input 33 on conductor 34 relative to ground conductor 32 and output from the filter at output 35 on conductor 36 relative to ground 32. Conductors 34 through 40 and 45 are located on the upper surface of the layer of the piezoelectric material and conductors 41 through 44 are located on the lower surface of the layer of piezoelectric material.

Series resonator X31 consists of the area of the layer of piezoelectric material that is sandwiched between the approximate area of overlap of conductor 41 and conductor 34. The remaining resonators depicted in FIG. 3A, which are identified as X32A, X32B, X33AA, X33AB, X33BA, X33BB, X34A, X34B, X35A, X35B, X36A, X36B, X37AA, X37BA, X37AB, X37BB, X38A, X38B and X39, similarly consist of respective areas of piezoelectric material sandwiched between the overlapped areas of conductors located on the upper and lower surfaces of the layer of piezoelectric material. The overlapping areas of the bounding conductors together with the piezoelectric material sandwiched between these bounding layers operate as the resonators.

Figure 3B:
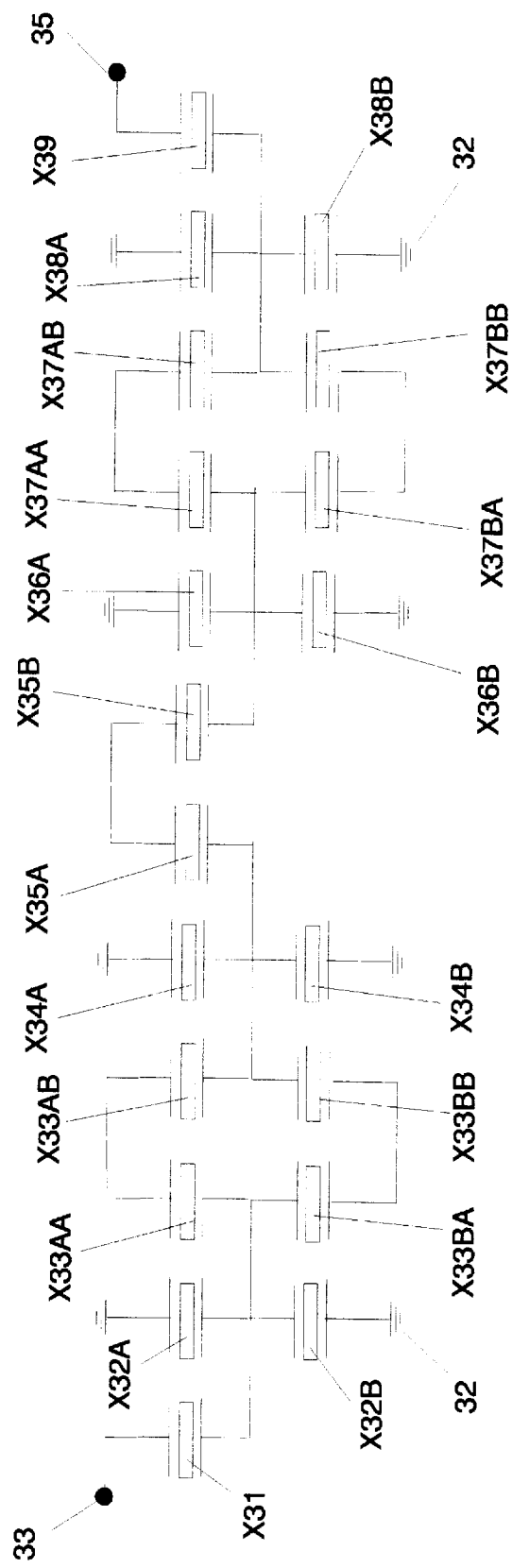
FIG. 3B is a simplified schematic diagram of the invention and FIG. 3C is a schematic diagram of the invention that has been further simplified by combining serial and parallel combinations of resonators into single resonators.
Figure 3C:
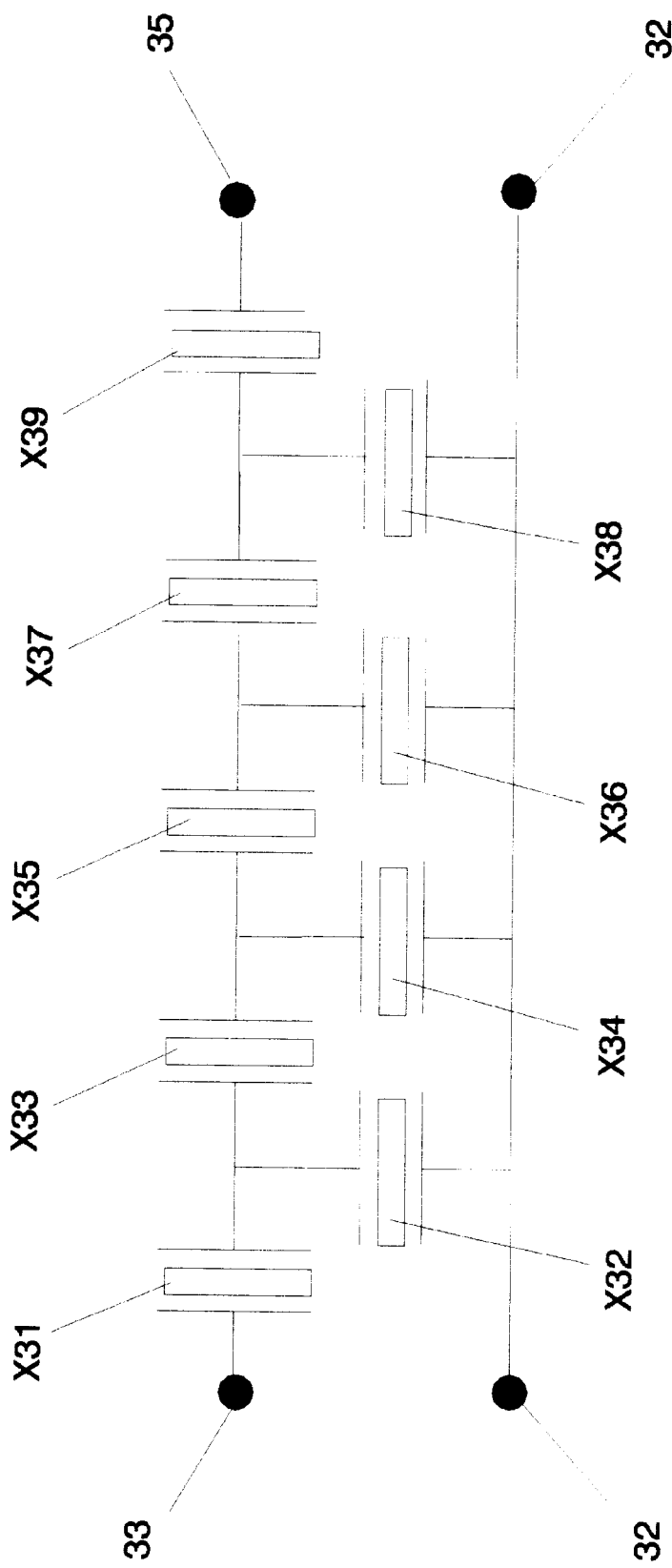

FIG. 3B is a schematic diagram of a simplified equivalent circuit of the filter depicted in FIG. 3A. FIG. 3C is a schematic diagram of the circuit depicted in FIG. 3B which has been further simplified by replacing the serial and/or parallel combinations of resonators with equivalent single resonators. For example, resonator X33AA is connected in series with resonator X33AB and resonator X33BA is connected in series with resonator X33BB and these two pairs of serially connected resonators are connected together in parallel with each other. In FIG. 3C, the serial/parallel combination of resonators X33AA, X33AB, X33BA and X33BB have been replaced by a single equivalent series resonator X33. Similarly resonators X32A and X32B, which are connected in parallel to the ground, have been replaced by a single equivalent shunt resonator X32. It is apparent from FIG. 3C, that the odd numbered resonators operate as series resonators and that the even numbered resonators operate as shunt resonators in a ladder filter. In the preferred embodiment, resonators X33AA, X33AB, X33BA and X33BB are all fabricated so as to have approximately the same size and shape and to have approximately the same electrical characteristics. In a similar manner each set of resonators that together are represented by each of the resonators in FIG. 3C are fabricated so that each resonator of the set has approximately the same characteristics as each of the other members of the set. However, it should be understood that the shapes and sizes of these resonators need not necessarily be equal so long as the desired effective impedance for the composite of each set of resonators is achieved while also approximately maintaining a symmetrical distribution of currents flowing in the device.

All of the resonators depicted in FIG. 3A are laid out in a symmetrical fashion about centerline 46. As a consequence of this symmetry, the path length for current flowing in the ground conductor from the vicinity of input 33 to X32A is the same as the path length from the vicinity of input 33 to X32B. As a further consequence of this symmetry, the inductances associated with these ground paths are the same. The same similarity in path lengths within the ground conductor holds as well for the other sets of shunt resonators in the device as well as for the series resonators in the device. In contrast, the device depicted in FIG. 2 does not exhibit this symmetry. As a consequence of the symmetry depicted in FIG. 3A, the device of this invention provides a compact filter that avoids the degradation in filter performance that otherwise would arise from the asymmetrical positioning of the resonators in such a compact configuration. In the preferred embodiment the resonators, as depicted in FIG. 3A, are arranged in a symmetrical fashion about centerline 46, and the inner boundaries of ground conductor 32 are also symmetrically located with respect to the centerline. It should be understood, however, that in the preferred embodiment of this invention, the outer bounds of ground conductor 32 need not be symmetrical with respect to centerline 46 because significant amounts of current normally flow within this device only near the inner boundaries of the ground conductor.

It should be understood that although the preferred embodiment of the invention has been depicted in the form of a filter in which the input and the output comprise serial connections to series resonators, the invention could also be embodied in a filter wherein either the input or the output, or both, include initial input or final parallel output connections to shunt resonators, e.g. a "pi" network or an "L" network. The filter network of this invention may also take the form of a balanced ladder network or a lattice network of resonators.

It should be understood that although the preferred embodiment is a device that is designed to operate at microwave frequencies, the application of this invention is not limited to microwave frequencies, but may have application at both higher and lower frequencies.

I claim:

1. A piezoelectric resonator filter of the type having a plurality of piezoelectric resonators comprising,
    a ground conductor,
    a plurality of shunt piezoelectric resonators, each shunt piezoelectric resonator having two electrodes and one of which electrodes is connected to the ground conductor,
    a plurality of series piezoelectric resonators, each series piezoelectric resonator having two electrodes, neither of which electrodes is connected directly to the ground conductor,
    the plurality of series piezoelectric resonators including at least one set of four series piezoelectric resonators consisting of one pair of series piezoelectric resonators connected in serial with each other and a second pair of series piezoelectric resonators connected in serial with each other, the first pair of series piezoelectric resonators being connected in parallel with the second pair of series piezoelectric resonators.

2. The device of claim 1 having a centerline and the plurality of series piezoelectric resonators being located substantially symmetrically about the center line and the plurality of shunt piezoelectric resonators being located substantially symmetrically about the center line and the plurality of series piezoelectric resonators being electrically interconnected with the plurality of shunt piezoelectric resonators.

3. The device of claim 2 being a monolithic device.

4. The device of claim 1 being a monolithic device.

5. A piezoelectric resonator filter of the type having a plurality of piezoelectric resonators comprising,
    a ground conductor,
    a plurality of shunt piezoelectric resonators, each shunt piezoelectric resonator having two electrodes and one of which electrodes is connected to the ground conductor,
    a plurality of series piezoelectric resonators, each series piezoelectric resonator having two electrodes, neither of which electrodes is connected directly to the ground conductor,
    the plurality of series piezoelectric resonators including at least one set of at least four series piezoelectric resonators interconnected to each other in serial and parallel combinations.

6. The device of claim 5 having a centerline and the plurality of series piezoelectric resonators being located substantially symmetrically about the center line and the plurality of shunt piezoelectric resonators being located substantially symmetrically about the center line and the plurality of series piezoelectric resonators being electrically interconnected with the plurality of shunt piezoelectric resonators.

7. The device of claim 6 being a monolithic device.

8. The device of claim 5 being a monolithic device.

9. A piezoelectric resonator filter of the type having a plurality of piezoelectric resonators comprising,
    a ground conductor,
    a plurality of shunt piezoelectric resonators, each shunt piezoelectric resonator having two electrodes and one of which electrodes is connected to the ground conductor,
    a plurality of series piezoelectric resonators, each series piezoelectric resonator having two electrodes, neither of which electrodes is connected directly to the ground conductor,
    the plurality of series piezoelectric resonators including at least one set of at least four series piezoelectric resonators interconnected to each other in serial and parallel combinations,
    the plurality of shunt piezoelectric resonators including at least one set of at least two shunt piezoelectric resonators connected to each other in parallel.

10. The device of claim 9 being a monolithic device.

11. The device of claim 9 having a centerline and the plurality of series piezoelectric resonators being located substantially symmetrically about the center line and the plurality of shunt piezoelectric resonators being located substantially symmetrically about the center line and the plurality of series piezoelectric resonators being electrically interconnected with the plurality of shunt piezoelectric resonators.

12. The device of claim 11 being a monolithic device.

* * * * *